United States Patent
Qin

(10) Patent No.: US 10,804,938 B2
(45) Date of Patent: Oct. 13, 2020

(54) DECODING DATA USING DECODERS AND NEURAL NETWORKS

(71) Applicant: Western Digital Technologies, Inc., San Jose, CA (US)

(72) Inventor: Minghai Qin, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 94 days.

(21) Appl. No.: 16/141,806

(22) Filed: Sep. 25, 2018

(65) Prior Publication Data

US 2020/0099401 A1   Mar. 26, 2020

(51) Int. Cl.
*H03M 13/29* (2006.01)
*G06N 3/08* (2006.01)
*H03M 13/11* (2006.01)
*H03M 13/00* (2006.01)

(52) U.S. Cl.
CPC .......... *H03M 13/2906* (2013.01); *G06N 3/08* (2013.01); *H03M 13/1102* (2013.01); *H03M 13/615* (2013.01)

(58) Field of Classification Search
CPC .......... H03M 13/2906; H03M 13/1102; H03M 13/615; G06N 3/08
USPC .......... 714/755, 752, 763, 773, 786; 375/224
See application file for complete search history.

(56) References Cited

U.S. PATENT DOCUMENTS

| | | | |
|---|---|---|---|
| 9,633,740 B1 * | 4/2017 | Alhussien | G11C 16/28 |
| 9,973,213 B2 * | 5/2018 | Hsiao | H03M 13/1108 |
| 2008/0312926 A1 * | 12/2008 | Vair | G10L 17/16 |
| | | | 704/249 |
| 2013/0219108 A1 * | 8/2013 | Yang | G06F 11/1068 |
| | | | 711/103 |
| 2016/0065315 A1 * | 3/2016 | Koike-Akino | H04L 1/0054 |
| | | | 398/44 |
| 2016/0358606 A1 * | 12/2016 | Ramprashad | G10L 15/32 |
| 2017/0126360 A1 * | 5/2017 | Millar | H04L 1/0057 |
| 2017/0262334 A1 * | 9/2017 | Uchikawa | G11C 16/10 |
| 2018/0025257 A1 * | 1/2018 | van den Oord | G06K 9/4652 |
| | | | 375/240.14 |

(Continued)

FOREIGN PATENT DOCUMENTS

EP        2109271 A1 * 10/2009 ............... H04L 1/06

OTHER PUBLICATIONS

Abdelbaki et al., Random Neural Network Decoder for Error Correcting Codes, 1999, IEEE, pp. 3241-3245. (Year: 1999).*

(Continued)

*Primary Examiner* — John J Tabone, Jr.
(74) *Attorney, Agent, or Firm* — Womble Bond Dickinson (US) LLP; Tony T. Chen

(57) ABSTRACT

Systems and methods are disclosed for decoding data. A first block of data may be obtained from a storage medium or received from a computing device. The first block of data includes a first codeword generated based on an error correction code. A first set of likelihood values is obtained from a neural network. The first set of likelihood values indicates probabilities that the first codeword will be decoded into one of a plurality of decoded values. A second set of likelihood values is obtained from a decoder based on the first block of data. The second set of likelihood values indicates probabilities that the first codeword will be decoded into one of the plurality of decoded values. The first codeword is decoded to obtain a decoded value based on the first set of likelihood values and the second set of likelihood values.

20 Claims, 8 Drawing Sheets

(56) References Cited

U.S. PATENT DOCUMENTS

| | | | |
|---|---|---|---|
| 2018/0144248 A1* | 5/2018 | Lu | G06N 3/0445 |
| 2018/0300400 A1* | 10/2018 | Paulus | G06F 40/58 |
| 2018/0357530 A1* | 12/2018 | Beery | G06N 3/084 |
| 2019/0057683 A1* | 2/2019 | Sak | G06N 3/02 |
| 2019/0130251 A1* | 5/2019 | Lao | G06N 3/006 |
| 2019/0213253 A1* | 7/2019 | Ray | G06F 16/353 |
| 2019/0213254 A1* | 7/2019 | Ray | G06F 40/289 |
| 2019/0287012 A1* | 9/2019 | Celikyilmaz | G06F 16/345 |
| 2019/0362020 A1* | 11/2019 | Paulus | G06K 9/6274 |
| 2019/0378000 A1* | 12/2019 | Markram | G06N 3/0445 |
| 2020/0027444 A1* | 1/2020 | Prabhavalkar | G10L 15/063 |
| 2020/0051583 A1* | 2/2020 | Wu | G10L 25/18 |

OTHER PUBLICATIONS

Berber, Soft Decision Output Decoding (SONNA) Algorithm for Convolutional Codes Based on Artificial Neural Networks, Jun. 2004, IEEE, pp. 530-534. (Year: 2004).*

El-Khanny et al., Soft Decision Decoding of Block Codes Using Artificial Neural Network, 1995, IEEE, pp. 234-240. (Year: 1995).*

Extended European Search Report for counterpart EPO Application No. EP 19 17 9781.0, 9 pgs. (dated Jan. 7, 2020).

Pulakesh Upadhyaya, et al., "On LDPC decoding with natural redundancy," XP033302848, 2017 55th Annual Allerton Conference on Communication, Control, and Computing (Allerton), IEEE, pp. 680-687 (Oct. 3, 2017).

Eliya Nachmani et al., "Deep Learning Methods for Improved Decoding of Linear Codes," XP081306197, Accepted to IEEE Journal of Selected Topics in Signal Processing, 13 pgs. (Jun. 21, 2017).

Sebastian Cammerer, et al., "Scaling Deep Learning-based Decoding of Polar Codes via Partitioning," XP080748134, 6 pgs. (Feb. 22, 2017).

Pulakesh Upadhyaya, et al., "Representation-Oblivious Error Correction by Natural Redundancy," XP080942800, 7 pgs. (Nov. 9, 2018).

* cited by examiner

DECODING DATA USING DECODERS AND NEURAL NETWORKS

BACKGROUND

Field of the Disclosure

This disclosure relates to data storage devices. More particularly, the disclosure relates to decoding data using decoders and neural networks.

Description of the Related Art

Data storage devices may be used to store data used by computing devices. In addition, computing devices may communicate data with each other (e.g., transmit and/or receive data). To protect the data stored in the data storage devices and/or transmitted between computing devices from errors or corruption, the data may be encoded by generating parity data that may be stored/transmitted along with the data to facilitate error detection and correction.

SUMMARY

In some implementations, the present disclosure relates to a method. The method includes obtaining a first block of data from a storage medium. The first block of data includes a first codeword generated based on an error correction code. The method also includes obtaining a first set of likelihood values from a neural network. The first set of likelihood values indicates probabilities that the first codeword will be decoded into one of a plurality of decoded values. The method further includes obtaining a second set of likelihood values from a decoder based on the first block of data. The second set of likelihood values indicates probabilities that the first codeword will be decoded into one of the plurality of decoded values. The method further includes decoding the first codeword to obtain a decoded value based on the first set of likelihood values and the second set of likelihood values. The first set of likelihood values is based at least in part on previously decoded blocks of data that have been processed by the neural network, the previously decoded blocks of data including blocks of data that are adjacent to the first block of data or blocks of data that preceded the first block of data.

In some implementations, the present disclosure relates to a method. The method includes receiving, via a network interface, a first block of data transmitted by a computing device. The first block of data includes a first codeword generated by the computing device based on an error correction code. The method also includes obtaining a first set of likelihood values from a neural network. The first set of likelihood values indicates probabilities that the first codeword will be decoded into one of a plurality of decoded values. The method further includes obtaining a second set of likelihood values from a decoder based on the first block of data. The second set of likelihood values indicates probabilities that the first codeword will be decoded into one of the plurality of decoded values. The method further includes decoding the first codeword to obtain a decoded value based on the first set of likelihood values and the second set of likelihood values.

In some implementations, the present disclosure relates to an apparatus. The apparatus includes a processing device configured to obtain a first block of data. The first block of data includes a first codeword generated based on an error correction code. The processing device is also configured to obtain a first set of likelihood values from a neural network. The first set of likelihood values indicates probabilities that the first codeword will be decoded into one of a plurality of decoded values. The processing device is further configured to obtain a second set of likelihood values from a decoder based on the first block of data. The second set of likelihood values indicates probabilities that the first codeword will be decoded into one of the plurality of decoded values. The processing device is further configured to decode the first codeword to obtain a decoded value based on the first set of likelihood values and the second set of likelihood values.

BRIEF DESCRIPTION OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
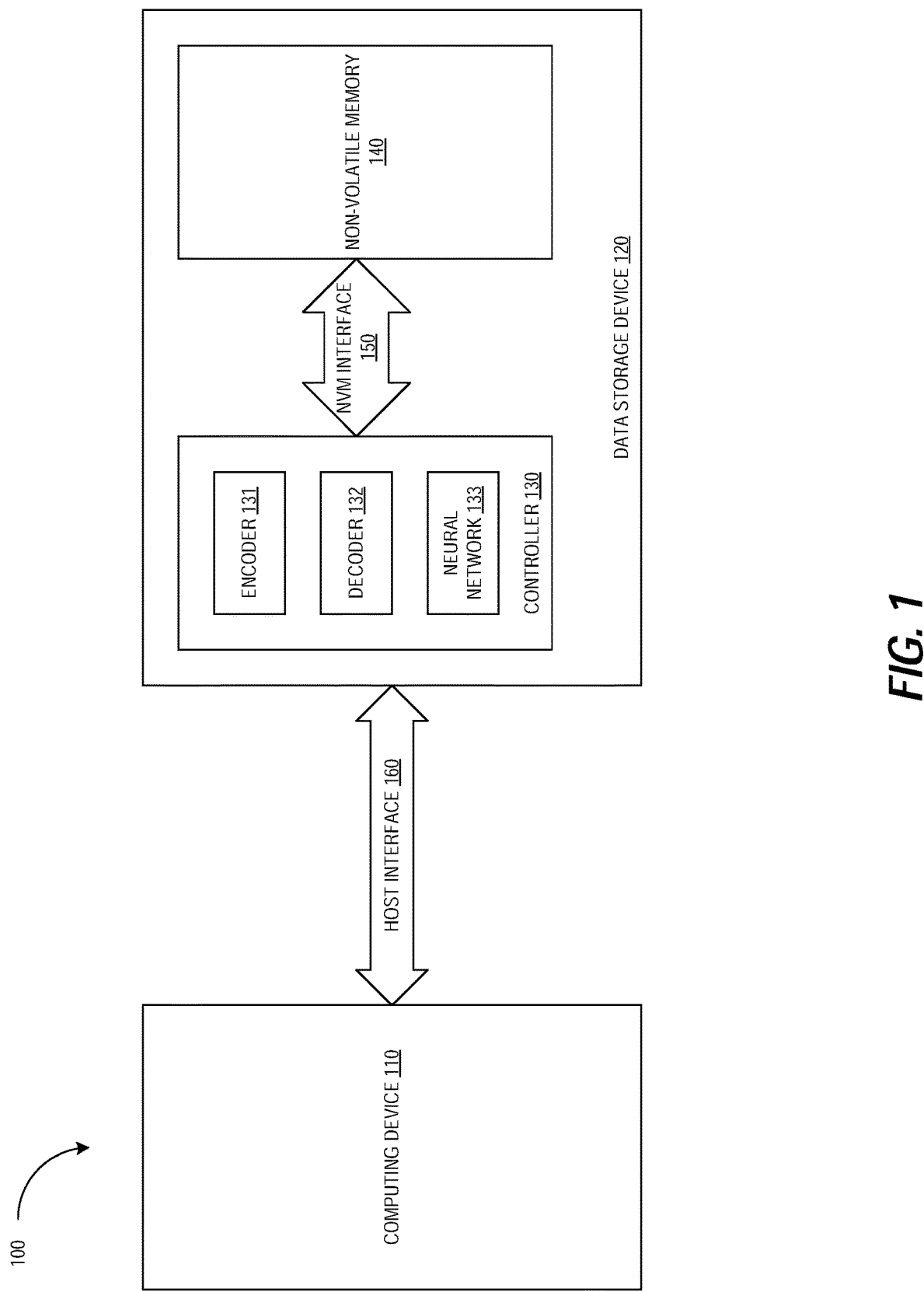
FIG. 1 is a diagram illustrating an example data storage system, in accordance with one or more embodiments of the present disclosure.

In the following disclosure, reference is made to examples, implementations, and/or embodiments of the disclosure. However, it should be understood that the disclosure is not limited to specific described examples, implementations, and/or embodiments. Any combination of the features, functions, operations, components, modules, etc., disclosed herein, whether related to different embodiments or not, may be used to implement and practice the disclosure. Furthermore, although embodiments of the disclosure may provide advantages and/or benefits over other possible solutions, whether or not a particular advantage and/or benefit is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in the claim(s).

The headings provided herein are for convenience only and do not necessarily affect the scope or meaning of the claimed invention. Disclosed herein are example implementations, configurations, and/or embodiments relating to decoding data that is stored on data storage devices and/or communicated between computing devices, using a decoder and a neural network.

Data storage devices, such as solid state drives (SSDs), hard disk drives (HDDs), hybrid drives (e.g., storage drives/devices that include both magnetic media/medium and flash memory), etc., typically include one or more controllers coupled with one or more non-volatile memory (NVM) arrays. Stored data may be subject to loss and/or corruption. For example, data may be lost, damaged, corrupted, etc., due to failure of memory cells, damage (e.g., physical damage), degradation, read/write disturbs, loss of data retention, loss of endurance, etc. Data storage devices may utilize one or more error correction codes (ECCs) and/or error coding mechanisms to detect and/or correct errors in the data that is stored within the data storage devices (e.g., stored within the NVM arrays). For example, parity data may be generated when writing data to a data storage device. The parity data may be stored along with the data in NVM arrays. For example, the parity data may be combined with the data to form codewords or the parity data may be appended to the data. When the controller retrieves the data from the non-volatile memory, the parity data may be used to decode the data (e.g., to decode the codeword that includes the encoded data). The parity data may also be used to determine the integrity of the retrieved data (e.g., to determine whether the data has errors, has been corrupted, etc.) and correct errors that may be detected by the controller.

One type of error correction or error coding mechanism that may be used by data storage devices to code data is low-density parity-check (LDPC) codes. To manage LDPC coding, the data storage devices may include a decoder and an encoder that utilize the LDPC codes for decoding and generating parity data, respectively. The decoding process performed by the decoder may involve an iterative decoding process where values (for example, probabilities or likelihoods of belief) are passed between variable nodes and check nodes to decode data.

Another type of error correction or error coding mechanism that may be used by data storage devices to code data is polar codes. To manage polar coding, the data storage devices may include a decoder and an encoder that utilize the polar codes for decoding and generating parity data, respectively. The decoding process performed by the decoder may involve a decoding process where the decoder may select one or more paths of a decoding tree to decode data.

FIG. 1 is a diagram illustrating an example data storage system 100, in accordance with some embodiments of the present disclosure. The data storage system 100 includes a computing device 110 and a data storage device 120. The computing device 110 may also be referred to as a host system. In one embodiment, the data storage device 120 may be part of the computing device 110 (e.g., may be located inside of a housing, chassis, case, etc., of the computing device 110). In another example, the data storage device 120 may be separate from the computing device 110 (e.g., may be an external device that is coupled to the computing device 110 via a cable, such as a universal serial bus (USB) cable).

The data storage device 120 may incorporate access command scheduling and/or execution in accordance with embodiments, examples, and/or implementations disclosed herein. The data storage device 120 may be any type of data storage device, drive, module, component, system, or the like. Furthermore, the terms "drive" and "data storage drive" may be used herein in certain contexts to refer to any type of data storage device, and may be used substantially interchangeably with the term "data storage device" herein in connection with various embodiments and/or in various contexts. As shown, the data storage device 120 (e.g., hybrid hard drive, solid-state drive, any storage device utilizing solid-state memory, a hard disk drive, any storage device utilizing magnetic media/medium, etc.) includes a controller 130 (e.g., control circuitry, software, firmware, or a combination thereof) and a non-volatile memory 140.

The non-volatile memory (NVM) 140 may be configured for long-term storage of data and may retain data between power on/off cycles of the data storage device 120. The non-volatile memory 140 and/or portions of the non-volatile memory 140 may also be referred to as a storage medium. In some embodiments, the non-volatile memory 140 may include solid-state memory. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, triple level cell (TLC) memory, X4 or quad-level cell (QLC) memory, etc.), NOR memory, EEPROM, Ferroelectric Memory (FeRAM), magnetoresistive RAM (MRAM), or other discrete solid-state memory chips. In other embodiments, the non-volatile memory 140 may include magnetic media (including shingle magnetic recording), optical disks, floppy disks, electrically programmable read only memories (EPROM), electrically erasable programmable read only memories (EEPROM), etc. Non-volatile memory that uses magnetic media/medium may include one or more magnetic platters. Each platter may contain one or more regions of one or more tracks of data. The non-volatile memory 140 may include any combination of the one or more types of memories described here. The non-volatile memory 140 may be divided logically and/or physically into arrays, planes, blocks, pages, tracks, and sectors.

The controller 130 may include one or more processors, memory devices, data and/or power transmission channels/paths, boards, or the like. In some embodiments, the controller 130 may be implemented as one or more system-on-a-chip (SoC) modules, field-programmable gate array (FPGA) modules, application-specific integrated circuit (ASIC) modules, processing devices (e.g., processors), chips, or the like. In other embodiments, one or more components of the controller 130 may be mounted on a printed circuit board (PCB). The controller 130 may be configured to receive data commands from a storage interface (e.g., a device driver) residing on the computing device 110.

The controller 130 may communicate with the computing device 110 over a host interface 160, and may receive commands via the host interface 160. These commands may be referred to as data commands, data access commands, data storage access commands, etc. Data commands may specify a block address in the data storage device 120. Data may be accessed/transferred based on such data commands. For example, the controller 130 may receive data commands (from the computing device 110) and may execute such commands on/in the non-volatile memory 140 (e.g., in one or more arrays, pages, blocks, sectors, etc.). The data commands received from computing device 110 may include read data commands, write data commands, and erase data commands. The controller 130 may be coupled to the non-volatile memory (NVM) 140 via a NVM interface 150. In one embodiment, the NVM interface 150 may include a plurality of channels (e.g., one or more lines, pines, wires, traces, etc.) and each channel may be coupled to different portions of the non-volatile memory 140 (e.g., different NVM arrays, different flash arrays, etc.).

The controller 130 may execute the received data commands to read, write, and erase data from non-volatile memory 140, via the NVM interface 150. For example, the commands may include a read command (e.g. a data read command) to read a block of data from the non-volatile memory 140. The controller 130 may read the data from the page and may transmit the data to the computing device 110 via the host interface 160. In another example, the commands may include a write command (e.g., a data write command) to write data to a page in a non-volatile memory 140. In one embodiment, write commands may include program commands (e.g., a command to write the value "1" to a location the non-volatile memory 140) and erase commands (e.g., a command to write the value "0" to a location, a page, a block, etc., in the non-volatile memory array). The controller 130 may receive the data from the computing device 110 via the host interface 160 and may write the data to the page.

The data storage device 120 may store data received from the computing device 110 such that the data storage device 120 acts as data storage for the computing device 110. To facilitate this function, the controller 130 may implement a logical interface. The logical interface may present to the computing device memory as a set of logical addresses (e.g., sequential/contiguous addresses) where data may be stored. Internally, the controller 130 may map logical addresses to various physical memory addresses in the non-volatile memory arrays 141 and/or other memory module(s). Mapping data indicating the mapping of logical addresses to physical memory addresses may be maintained in the data storage device. For example, mapping table data may be stored in non-volatile memory 140 in order to allow for recreation of mapping tables following a power cycle.

The controller 130 includes an encoder 131. The encoder 131 may encode data when storing the data on the non-volatile memory 140. The encoder 131 may encode the data to protect the data from errors, loss, corruption, etc. The encoder 131 may protect the data from errors, loss, corruption, etc., using various methods, techniques, functions, operations, actions, etc. For example, the encoder 131 may protect the data by generating parity data (e.g., parity bits). The parity bits may allow the controller 130 to determine whether there are errors in the data (e.g., errors due to corruption, damaged cells, damaged blocks, error while reading the data, etc.). The parity bits may also allow the controller 130 (e.g., the decoder 132) to correct or recover from errors in the data.

In some embodiments, encoder 131 encodes stored data using error correction codes (ECCs). An error correction code may include algorithms, methods, techniques, functions, operations, etc., that may encode data into codewords. The codewords (e.g., encoded data) may be decoded even though there may be errors in one or more portions of the codewords. For example, even though one or more bits of the codeword may be incorrect or corrupted (e.g., due to a faulty memory cell), the error correction code can still be used to decode or recover the data encoded in the codeword.

In one embodiment, one type of error correction code used by the encoder 131 may be may be a low-density parity-check code (LDPC). For example, the encoder 131 may be a binary LDPC encoder that uses a binary LDPC to encode the data that is stored in the non-volatile memory 140 into LDPC codewords. In another example, the encoder 131 may be a non-binary LDPC encoder that uses a non-binary LDPC to encode data into LDPC codewords. A LDPC codeword may be a string or series of bits (e.g., a bit string) that is generated based on the data received by the encoder 131 (which is to be stored on the non-volatile memory 140). The LDPC codeword may allow the data, which is encoded in the LDPC codeword, to be recovered when errors occur. For example, the data encoded in the LDPC codeword may be recovered (e.g., may be properly decoded) even though one or more bits of the LDPC codeword may be incorrect or have errors due to a failure in a portion of the non-volatile memory 140 (e.g., due to a faulty/bad memory cell).

In one embodiment, one type of binary code used by the encoder 131 may be may be a polar code. For example, the encoder 131 may be a polar code encoder that uses one or more polar codes to encode the data that is stored in the non-volatile memory 140 into polar code codewords. A polar code codeword may be a string or series of bits (e.g., a bit string) that is generated based on the data received by the encoder 131 (which is to be stored on the non-volatile memory 140). The polar code codeword may allow the data, which is encoded in the polar code codeword, to be recovered when errors occur. For example, the data encoded in the polar code codeword may be recovered (e.g., may be properly decoded) even though one or more bits of the polar code codeword may be incorrect or have errors due to a failure in a portion of the non-volatile memory 140 (e.g., due to a faulty/bad memory cell).

The controller 130 includes a decoder 132 in one embodiment. The decoder 132 may decode data that stored on the non-volatile memory 140, and may be separate from the controller 130 in certain embodiments. Regardless of whether the decoder is implemented as part of the controller 130 or not, in some embodiments, decoder 132 decodes stored data (e.g., data encoded into codewords which are stored on the non-volatile memory 140) using ECCs. For example, the decoder 132 may decode codewords which encode the data that is stored on the non-volatile memory 140. The decoder 132 may perform error detection to determine the integrity of data retrieved from non-volatile memory 140 (e.g., to determine the integrity of the data encoded in a codeword). The decoder 132 may also perform error correction of retrieved data. For example, the decoder 132 may use parity data, codewords, etc., to recover the data. The data that is decoded by the decoder 132 (e.g., decoded from a codeword) may be referred to as a decoded value, decoded data, etc.

Even with the use of ECCs, there may be instances, situations, times, etc., when the decoder 132 may not be able to decode or recover the data encoded in the codewords. For example, there may be too many errors (e.g., wrong/incorrect bits) in a codeword (e.g., a LDPC codeword, a polar code codeword, etc.) for the decoder 132 to decode or recover the data encoded in the codeword. When there are too many errors, the decoder 132 may be unable to recover or decode because the ECC the number of error may be more than the ECC is able to tolerate. In addition, even though the decoder 132 may be able to decode data, it may be useful to increase the robustness of the decoder 132 to help ensure that the decoder 132 is correctly decoding data.

As illustrated in FIG. 1, the controller 130 includes a neural network 133. The neural network 133 may be used in machine learning tasks. In some embodiments, the neural network 133 may include a collection of connected and/or interconnected nodes. The nodes may also be referred to as neurons. Each node may transmit a signal, messages, data, information, etc., to one or more other nodes. A node may receive a signal, message, data, information, etc., from another node and may generate additional signals, messages, data, information, etc., to transmit to other nodes that are connected to it. The neural network 133 may be a computing model that may be used to determine a feature in input data through various computations. The neural network 133 may determine a feature (e.g., a number, shape, pattern, etc.) in input data (e.g., audio data, image data, video data, etc.) according to a structure that defines a sequence of computations to be performed, and weight values that define coefficients applied to the computations. The neural network 133 may also include weights or weight values. The weights or weight values may be scaling factors between two or more nodes. For example, the structure may be represented as connections of different nodes, where each node represents a summation of its inputs, and a weight value associated with a connection may represent a coefficient or a scaling factor multiplied to an output of a node in that connection.

In one embodiment, the neural network 133 may be a convolutional neural network (CNN). A CNN may be a feed forward neural network. A feed forward neural network may be a type of neural network where the connections between the nodes do not form a cycle. For example, the signals, messages, data, information etc., flow forward from the input nodes, through the hidden nodes, to the output nodes of the CNN. CNNs are discussed in more detail below.

In another embodiment, the neural network 133 may be a recurrent neural network (RNN). A RNN may be a neural network where the connections between nodes may form a directed graph. A RNN may be a type of neural network where the connections between the nodes may form a cycle. For example, the node of a RNN may be directed back towards a node in a previous layer or sub-layer. This may allow a RNN to exhibit temporal dynamic behavior.

In some embodiments the neural network 133 may analyze the data (e.g., decoded values) that was previously decoded from the previous codewords (e.g., from LDPC or polar code codewords) by the decoder 132. For example, if the data from the codewords are blocks, pixels, portions, etc., of an image (e.g., a digital image), the neural network 133 may analyze the blocks, pixels, portions, etc., of the image that were previously decoded (e.g., may analyze the content and/or decoded values that were previously decoded). In one embodiment, the previous codewords may be codewords that preceded the codeword that is currently being decoded by the decoder 132. For example, if the decoder 132 is decoding an image row by row, the previous codewords may be codewords that preceded the current codeword and were within the same row as the current codeword. In another example, if the decoder 132 is decoding an image, the previous codewords may be codeword that are adjacent to the current codeword within the image.

In some embodiments the neural network 133 may analyze the data that was previously decoded from the previous codewords decoded by the decoder 132. The previous codewords may be codewords that preceded the codeword that is currently being decoded by the decoder 132 or may be adjacent to the codeword within a data object. The data object may be data structure that may be divided into different portions. The different portions of the data object may be encoded into the codewords which may be stored on a non-volatile memory. For example, the data object may be a file, such as a text file, an image file (e.g., a digital image), a video file (e.g., a digital video), etc. The data object may organize the codewords in a certain configuration, order, and/or layout. For example, if the data object is an image (e.g., a digital image), each codeword may encode a pixel of the image. The image layout of the image may indicate the layout of the image (e.g., the height and width of the image in pixels) and may indicate the order of the pixels (e.g., which row and/or column a pixel is located). In one embodiment, the configuration/layout of the data object may indicate where a codeword/value is located with respect or relative to other codewords in the data object. For example, the configuration/layout may indicate that a first codeword value is surrounded by other codewords/values. In another example, the configuration/layout may indicate that a first codeword/value is the last codeword/value in a row of codewords/values.

The neural network 133 may obtain (e.g., determine, generate, calculate, etc.) a set of likelihood values. The set of likelihood values may indicate one or more probabilities that a codeword, which is being decoded by the decoder 132, may be decoded into different decoded values. For example, if a codeword may be decoded into one of eight possible decoded values (e.g., eight possible three-bit strings), the set of likelihood values may indicate eight likelihood values. Each of the eight likelihood values may indicate a probability that that the codeword may be decoded to a respective decoded value. The set of likelihood values determined, obtained, generated, calculated, etc., by the neural network 133 may be provided to the decoder 132, as discussed in more detail below. Likelihood values may be values (e.g., numbers, alphanumeric strings, etc.) that indicate/represent probabilities, odds, chances, possibilities, etc.

In one embodiment, the controller 130 may obtain a first block of data from the non-volatile memory 140. The block of data may include a first codeword generated based on or using an ECC. The first codeword may encode a value, a bit string, or some other value. The decoder 132 may obtain (e.g., determine, generate, calculate, etc.) a set of likelihood values. The set of likelihood values may indicate one or more probabilities that a codeword may be decoded into different decoded values, as discussed above. The decoder 132 may decode the codeword based on the set of likelihood values obtained from the neural network 133 (e.g., a first set of likelihood values) and based on the set of likelihood values obtained by the decoder 132 (e.g., a second set of likelihood values), as discussed in more detail below. For example, the decoder 132 may combine each likelihood value from the first set of likelihood values (from the neural network 133) with a respective likelihood value from the second set of likelihood values (from the decoder 132).

In one embodiment, the decoder 132 may be a LDPC decoder and the neural network 233 may be a CNN. The LDPC decoder may include a set of variable nodes and a set of check nodes. The CNN may provide a set of probabilities to one or more variable nodes of the LDPC, as discussed in more detail below. In another embodiment, the decoder 132 may be a polar code decoder and the neural network 233 may be a RNN. The RNN may perform list decoding and a decoding tree. The RNN may select different decoding paths (e.g., paths down the decoding tree).

In some embodiments, the neural network 133 and the decoder 132 may be able to decode or recover the data encoded in codewords in situations, instances, etc., where the decoder 132 alone may be unable to decode the codewords. For example, there may be too many errors (e.g., wrong/incorrect bits) in a codeword (e.g., a LDPC codeword, a polar code codeword, etc.) for the decoder 132 alone may be unable decode or recover the data encoded in the codeword. However, the neural network 133 may be able to analyze previously decoded codewords (e.g., analyze previously decoded values) and may be able determine what the decoded value for a code word may be based on content that was previously decided (e.g., based on previously decoded portions of an image, previously decoded text in a text file, etc.). This may allow the controller 130 to increase the error correction capabilities of the ECC without increasing the complexity of the ECC. This may also allow the controller 211 to operate more efficiently (e.g., to use less power and/or memory) and/or more quickly. This may further increase the robustness and/or reliability of the decoder 132.

Figure 2:
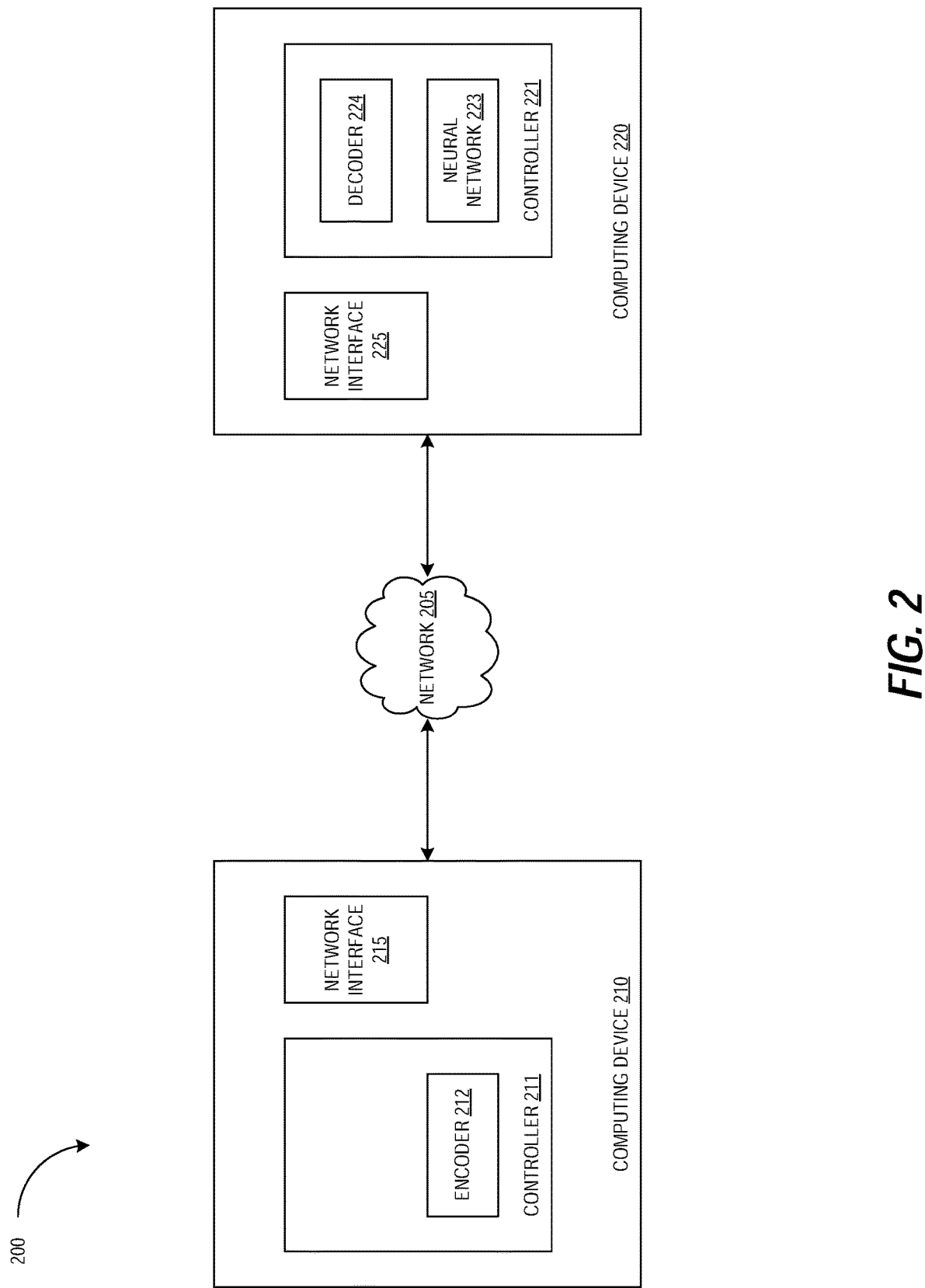
FIG. 2 is a diagram illustrating an example system architecture, in accordance with one or more embodiments of the present disclosure.

FIG. 2 is a diagram illustrating an example system architecture 200, in accordance with one or more embodiments of the present disclosure. The system architecture 200 includes a computing device 210 and a computing device 220 coupled to each other via a network 205. Examples of computing devices include, but are not limited to, phones (e.g., smart phones, cellular phones, etc.), cable set-top boxes, smart televisions (TVs), video game consoles, laptop computers, tablet computers, desktop computers, server computers, personal digital assistants, wearable devices (e.g., smart watches), media players, and/or other types of electronic devices. In one embodiment, network 205 may include a public network (e.g., the Internet), a private network (e.g., a local area network (LAN)), a wide area network (WAN) such as the Internet, a wired network (e.g., Ethernet network), a wireless network (e.g., an 802.11 network or a Wi-Fi network), a cellular network (e.g., a Long Term Evolution (LTE) network), routers, hubs, switches, server computers, other types of computer networks, and/or a combination thereof.

Computing device 210 includes a controller 211 and a network interface 215. The network interface 215 may be hardware (e.g., a network interface card), software (e.g., drivers, applications, etc.), and/or firmware that allows the computing device 210 to communicate data with the network 205. The network interface card may be used to transmit and/or receive blocks of data, packets, messages, etc.

As illustrated in FIG. 2, the controller 211 includes an encoder 212. The encoder 212 may encode data that is to be transmitted to the computing device 220 via the network 205. The encoder 212 may encode the data to protect the data from errors, loss, corruption, etc., during the transmission of the data. For example, the network 205 may be a wireless network and the data that is transmitted using radio-frequency signals. The radio-frequency signals may become corrupted due to interference or a weak radio-frequency signal. The encoder 212 may protect the data from errors, loss, corruption, etc., using various methods, techniques, functions, operations, actions, etc., as discussed above. The encoder 212 may encode data using ECCs. In one embodiment, the encoder 212 may be a LDPC encoder that uses a LDPC code. For example, the encoder 212 may be a non-binary LDPC encoder that uses a non-binary LDPC to encode data into LDPC codewords. In another embodiment, the encoder 212 may be a polar code encoder that uses a polar code.

Computing device 220 includes a controller 221 and a network interface 225. The network interface 225 may be hardware (e.g., a network interface card), software (e.g., drivers, applications, etc.), and/or firmware that allows the computing device 220 to communicate data with the network 205. As illustrated in FIG. 2, the controller 130 includes a decoder 224. The decoder 224 may decode data that is received from the computing device 210 via the network 205. The decoder 224 may decode data using ECCs. The decoder 224 may perform error detection to determine the integrity of data received from the computing device 210. The decoder 224 may also perform error correction of received data using the ECCs.

As discussed above, even with the use of ECCs, there may be instances, situations, times, etc., when the decoder 224 may not be able to decode or recover the data encoded in the codewords (e.g., blocks of data) that are received from the computing device 210. The controller 221 also includes a neural network 223. The neural network 223 may operate in conjunction with the decoder 224 to decode and/or correct data, as discussed herein. The neural network 223 may be a collection of connected and/or interconnected nodes. The neural network 223 may be a computing model that may be used to determine a feature in input data through various computations. The neural network 223 may determine a feature (e.g., a number, shape, pattern, etc.) in input data (e.g., audio data, image data, video data, etc.) according to a structure that defines a sequence of computations to be performed, and weight values that define coefficients applied to the computations. In one embodiment, the neural network 223 may be a CNN. In another embodiment, the neural network 223 may be RNN.

In some embodiments the neural network 223 may analyze the data that was previously decoded from the previous codewords received from the computing device 210. The previous codewords may be codewords that preceded the codeword that is currently being decoded by the decoder 224 or may be adjacent to the codeword within a data object. The data object may be data structure that may be divided into different portions which are encoded into codewords which may be transmitted to the computing device 220. For example, the data object may be a file, such as a text file, an image file (e.g., a digital image), a video file (e.g., a digital video), etc. The data object may organize the codewords in a certain order and/or layout, as discussed above.

In one embodiment, the neural network 223 may obtain a set of likelihood values that may indicate one or more probabilities that a codeword, which is being decoded by the decoder 224, may be decoded into different decoded values. The set of likelihood values determined, obtained, generated, calculated, etc., by the neural network 223 may be provided to the decoder 224. The decoder 224 may obtain a set of likelihood values associated with the codeword that is received by the network interface 225 (from the computing device 210). The set of likelihood values may indicate one or more probabilities that a codeword may be decoded into different decoded values, as discussed above. The decoder 224 may decode the codeword based on the set of likelihood values obtained from the neural network 223 (e.g., a first set of likelihood values) and based on the set of likelihood values obtained by the decoder 224 (e.g., a second set of likelihood values), as discussed in more detail below.

In one embodiment, the decoder 224 may be a LDPC decoder and the neural network 223 may be a CNN. In another embodiment, the decoder 224 may be a polar code decoder and the neural network 223 may be a RNN. In other embodiments, the decoder 224 may use different types of ECCs may be used in conjunction with different types of neural networks (e.g., different combinations of decoders and neural networks may be used).

In some embodiments, the neural network 223 and the decoder 224 may be able to decode or recover the data encoded in codewords in situations, instances, etc., where the decoder 224 alone may be unable to decode the codewords. This may allow the controller 211 to increase the error correction capabilities of the ECC without increasing the complexity of the ECC. This may also allow the controller 221 to operate more efficiently (e.g., to use less power and/or memory) and/or more quickly. This may also increase the robustness and/or reliability of the decoder 224.

Figure 3:
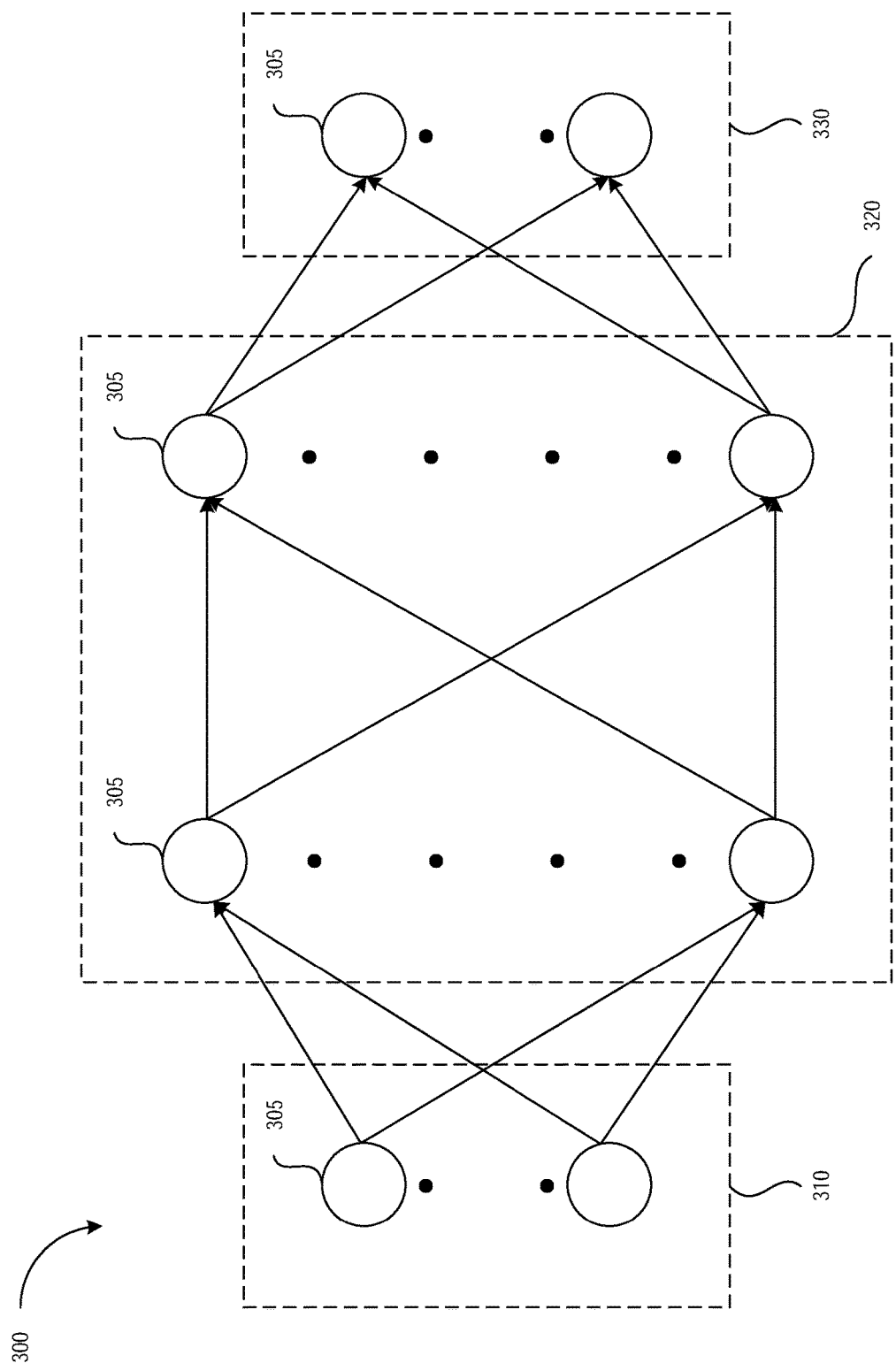
FIG. 3 is a diagram illustrating an example neural network, in accordance with one or more embodiments of the present disclosure.

FIG. 3 is a diagram illustrating an example neural network 300, in accordance with one or more embodiments of the present disclosure. The neural network 300 may be used to model relationships between (e.g., complex) inputs and outputs or to find patterns in data, where the dependency between the inputs and the outputs may not be easily ascertained. The neural network 300 may also be a computing model that may be used to determine a feature in input data through various computations. For example, the neural network 300 may determine a feature (e.g., a number, shape, pattern, etc.) in input data (e.g., audio data, image data, video data, etc.) according to a structure that defines a sequence of computations to be performed.

The neural network 300 may be a CNN. A CNN may be a feed forward neural network. A feed forward neural network may be a type of neural network where the connections between the nodes do not form a cycle. For example, the signals, messages, data, information etc., flow forward from the input layer 310 (e.g., from the input nodes), through the hidden layer 320, to the output layer 330 (e.g., to the output nodes) of the neural network 300 from left to right. The signals, messages, data, information etc., may not go backwards through the neural network (e.g., may not go from right to left). A CNN may be used for image analysis. The weights of the connections may take the form of a convolutional filter that may be applied to different pixels of an image. Although the present disclosure may refer to image analysis for CNNs, in other embodiments, the CNN may be used for other types of data and inputs.

The neural network 300 includes an input layer 310, a hidden layer 320, and an output layer 330. Each of the input layer 310, the hidden layer 320, and the output layer 330 includes one or more nodes 305. Each of the input layer 310, the hidden layer 320, and the output layer 330 may have a different number of nodes 305. The neural network 300 may be a deep neural network or a deep CNN. A neural network may be deep if the hidden layer 320 includes multiple levels (e.g., multiple columns of nodes 305, multiple sub-layers of nodes 305). As illustrated in FIG. 3, the neural network 300 includes two levels (or sub-layers) of nodes 305 (e.g., two columns of nodes 305).

Each of the nodes 305 in a layer is connected to either a node 305 in the next level (e.g., next sub-layer) or a node 305 in another layer, as represented by the arrows/lines between the nodes 305. For example, the nodes 305 in the input layer are each coupled to at least one node 305 in the hidden layer 320. Neural network 300 may be a fully connected neural network. For example, each node 305 in each layer or level is connector to each node in the subsequent layer or level where there is a subsequent layer or level (e.g., nodes 305 in the output layer 330 are not connected to other nodes).

Each connection may be associated with a weight or weight value (e.g., may have a weight). A weight or weight value may define coefficients applied to the computations. For example, the weights or weight values may be scaling factors between two or more nodes 305. Each node 305 may represent a summation of its inputs, and the weight or weight value associated with a connection may represent a coefficient or a scaling factor multiplied to an output of a node 305 in that connection. The weights between the nodes 305 may be determined, calculated, generated, assigned, learned, etc., during a training process for the neural network. For example, backpropagation may be used to set the weights such that the neural network 300 produces expected output values given corresponding values in labeled training data. Thus, the weights of the hidden layers can be considered as an encoding of meaningful patterns in the data. The weights of the connections between the nodes 305 may be modified by additional training.

Although neural network 300 is depicted with a particular number of nodes 305 layers, and connections, various neural network architectures/configurations may be used in other embodiments. For example, different fully connected neural networks and partially connected neural networks (e.g., where all nodes in adjacent layers are not connected) may be used.

Figure 4:
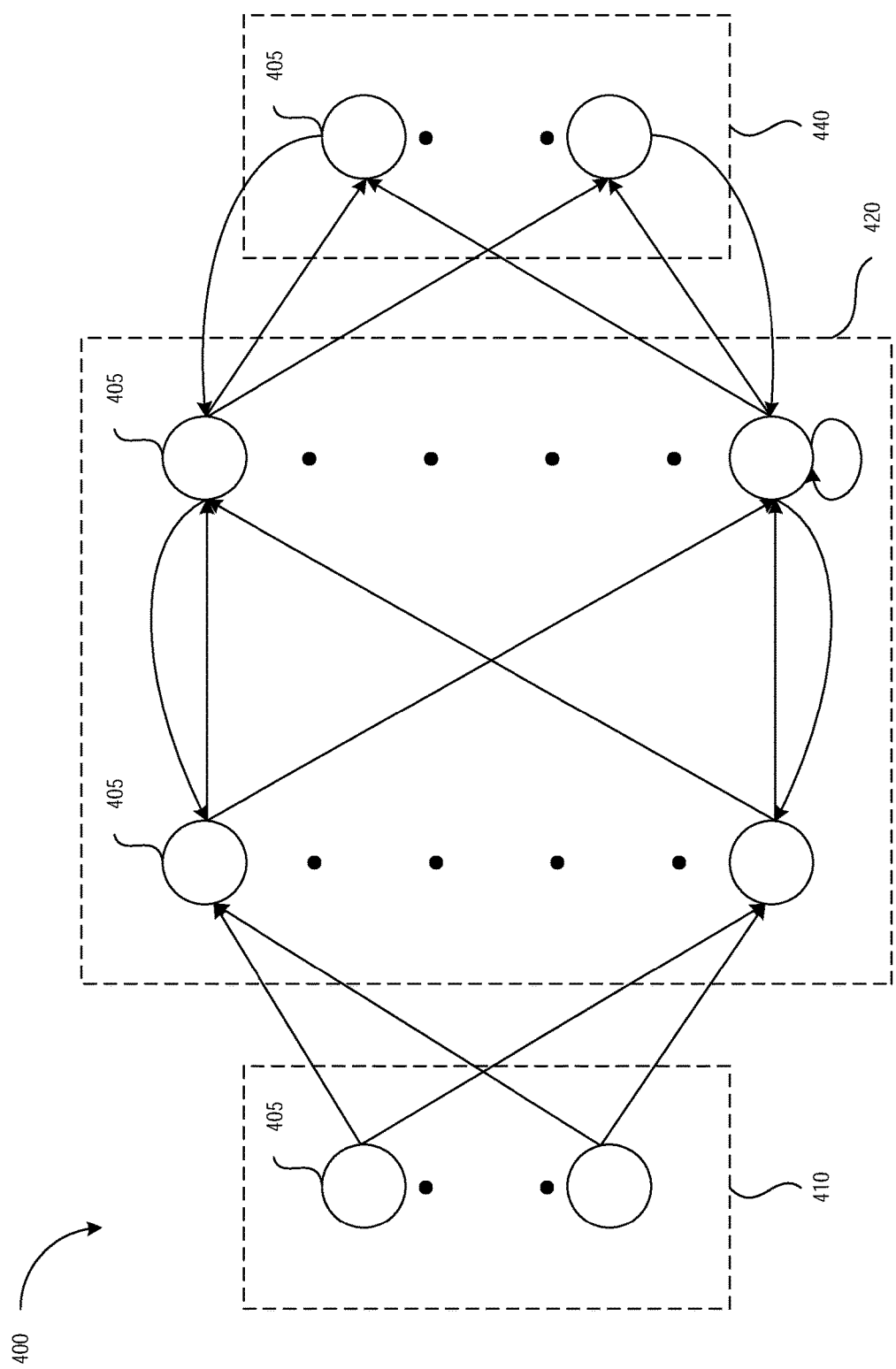
FIG. 4 is a diagram illustrating an example neural network in accordance with one or more embodiments of the present disclosure.

FIG. 4 is a diagram illustrating an example neural network 400, in accordance with one or more embodiments of the present disclosure. The neural network 400 may be used to model relationships between inputs and outputs or to find patterns in data, where the dependency between the inputs and the outputs may not be easily ascertained. The neural network 400 may also be a computing model that may be used to determine a feature in input data through various computations.

In another embodiment, the neural network 400 may be a RNN. A RNN may be a neural network where the connections between nodes may form a directed graph. A RNN may be a type of neural network where the connections between the nodes may form a cycle and/or may go in a backwards direction. For example, the signals, messages, data, information etc., may flow both forward (e.g., from left to right) and backwards (e.g., from right to left) between the nodes 405 of the neural network. The RNN may use memory units, such as long-short-term-memory (LSTM) units. The LSTM units may allow the RNN to backpropagate errors through layers (e.g., backwards through the layers or sub-layers) over time. This may allow a RNN to exhibit temporal dynamic behavior. Although the present disclosure may refer to sequence analysis and/or prediction for RNNs, in other embodiments, the RNN may be used for other types of data and inputs.

The neural network 400 includes an input layer 410, a hidden layer 420, and an output layer 440. Each of the input layer 410, the hidden layer 420, and the output layer 440 includes one or more nodes 405. Each of the input layer 410, the hidden layer 420, and the output layer 440 may have a different number of nodes 405. The neural network 400 may be a deep neural network or a deep RNN. A neural network may be deep if the hidden layer 420 includes multiple levels (e.g., multiple columns of nodes 405, multiple sub-layers of nodes 405). As illustrated in FIG. 4, the neural network 400 includes two levels (or sub-layers) of nodes 405 (e.g., two columns of nodes 405). A RNN may be used for sequence analysis and/or prediction. For example, the RNN may recognize patterns in sequences of data, such as handwriting, text, numerical time series data, etc.

Each of the nodes 405 in a layer is connected to at least one other node, as represented by the arrows/lines between the nodes 405. Each connection may be associated with a weight or weight value (e.g., may have a weight). A weight or weight value may define coefficients applied to the computations. Each node 405 may represent a summation of its inputs, and the weight or weight value associated with a connection may represent a coefficient or a scaling factor multiplied to an output of a node 405 in that connection. The weights between the nodes 405 may be determined, calculated, generated, assigned, learned, etc., during a training process for the neural network. Thus, the weights of the hidden layers can be considered as an encoding of meaningful patterns in the data. The weights of the connections between the nodes 405 may be modified by additional training.

Although neural network 400 is depicted with a particular number of nodes 405 layers, and connections, various neural network architectures/configurations may be used in other embodiments. For example, different fully connected neural networks and partially connected neural networks (e.g., where all nodes in adjacent layers are not connected) may be used.

Figure 5:
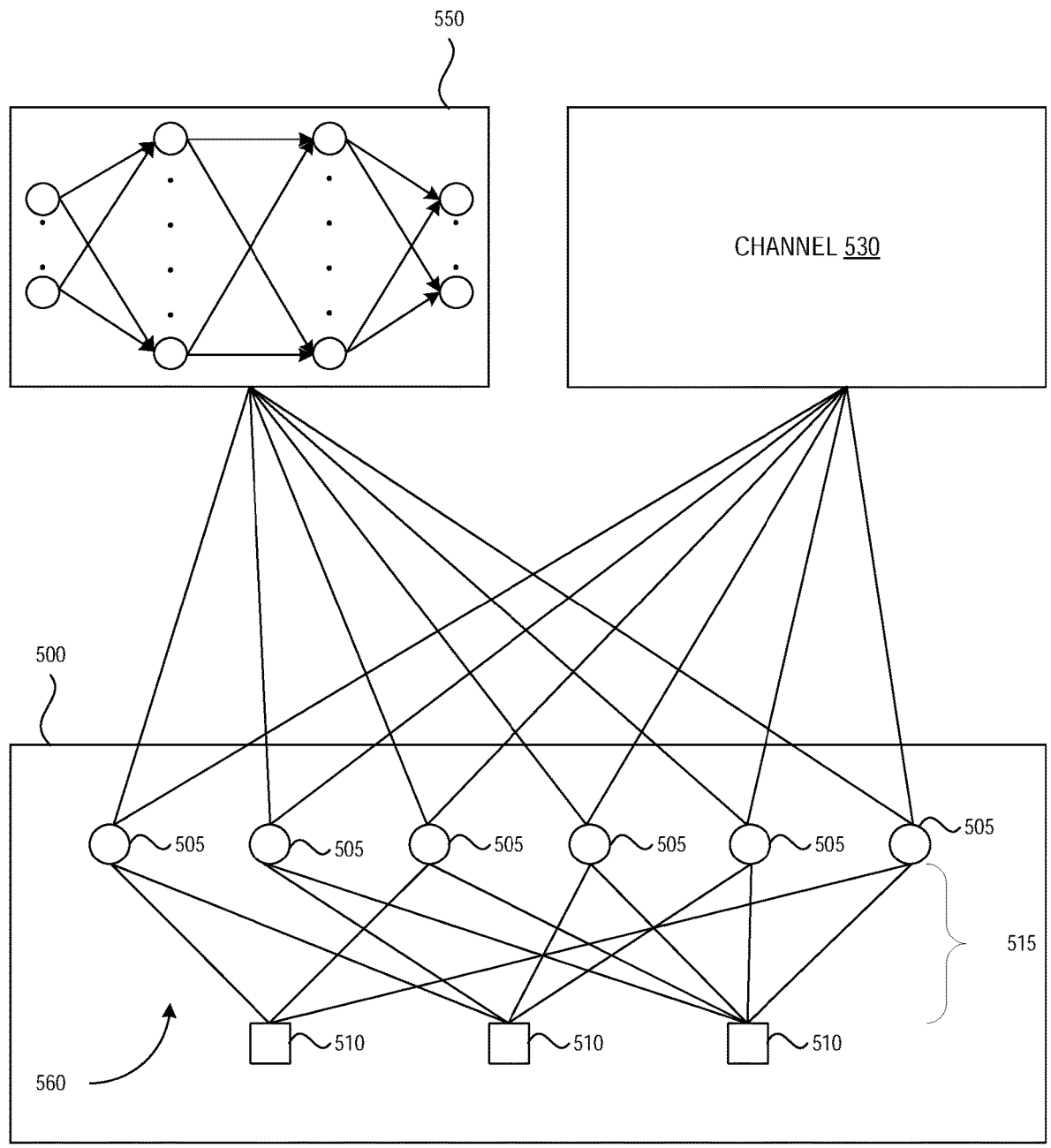
FIG. 5 is a diagram illustrating an example decoder and neural network, in accordance with one or more embodiments of the present disclosure.

FIG. 5 is a diagram illustrating an example decoder 500 and neural network 550, in accordance with one or more embodiments of the present disclosure. The decoder 500 may be a LDPC decoder for decoding one or more bits of a codeword. The codewords may be received via a channel 530. In one embodiment, the channel 530 may be a communication channel between a controller and a non-volatile memory (e.g., NVM interface 150 illustrated in FIG. 1). In another embodiment, the channel 530 may be a communication channel between two computing devices (e.g., between a transmitting computing device and a receiving computing device). The codewords received on or via the channel 530 may have been encoded by encoder, such as a LDPC encoder.

Decoder 500 may be configured to divide the codeword among a plurality of variable nodes 505. In binary LDPC decoders, each variable node 505 contains a single bit to store a logical one or a logical zero. In non-binary LDPC decoders, each variable node 505 contains symbols representing a group of bits. In either binary LDPC decoders or non-binary LDPC decoders, the variable nodes 505 may be related or relatable to each other by a plurality of check nodes 510 or constraint nodes.

In decoding the codewords, messages are passed between variable nodes 505 and check nodes 510 according to connections or edges 515. Each variable node 505 may include a confidence value for one or more bits of the codeword. A confidence value may provide some indication as to whether these bits of the codeword are correct or valid. The number of variable nodes 505, check nodes 201-2013, and edges 515 may be schematically represented by a tanner graph 560 as illustrated in FIG. 5. The number of variable nodes 505, check nodes 510, and edges 515 may be determined based upon the strength and complexity of the decoder 500.

Messages are passed between connected variable nodes 505 and check nodes 510 in an iterative process in which beliefs about the values that should appear in variable nodes are passed back-and-forth. Parity checks are performed in the check nodes 510 based on the messages received from the variable nodes 505 and the results are returned to connected variable nodes 505 to update the beliefs, if necessary. By providing multiple check nodes 510 for the group of variable nodes 505, redundancy in error checking is provided enabling errors to be detected and corrected.

Each check node 510 performs a parity check on bits or symbols passed to the check node 510 as messages from the variable nodes 505 that are connected to the check node. For example, the first check node 510 (from the left) checks the parity of the first, third, and sixth variable nodes 505 (from the left), the second check node 510 (from the left) checks the parity of the first, second, fourth, and fifth variable nodes 505 (from the left), and the third check node 510 (from the left) checks the parity of the second, third, fourth, fifth, and sixth variable nodes 505 (from the left).

Values are passed back and forth between variable nodes 505 and connected check nodes 510 along edges 515 in an iterative process until the LDPC code converges on a value for the group of data and parity bits in the variable nodes 505. For example, the first check node 510 (from the left) pass messages to the parity first, third, and sixth variable nodes 505 (from the left). The first, third, and sixth variable nodes 505 (from the left) pass messages to the first check node 510 (from the left). The messages between variable nodes 505 and check nodes 510 may be probabilities or beliefs. Each message from a check node represents the probability that a bit or symbol (e.g., multiple bits) has a certain value based on the current value of the node and on previous messages to the node. Decoding iterations are performed by passing messages back and forth between variable nodes 505 and check nodes 510 with the values in the variable nodes 505 being adjusted based on the messages that are passed until the values converge and stop changing or until processing is halted. The values in variable nodes 505 may converge in a single iteration of messages being passed from variable nodes 505 to check nodes 510 or in multiple iterations.

As discussed above, the neural network 550 may be a CNN. The neural network 550 may analyze code words that were previously decoded by the decoder 500 (e.g., previous decoded values). For example, an image (e.g., an image file) may be received via the channel 530 (e.g., received from another computing device or retrieved/read from a non-volatile storage). The pixels of the image may be scanned row by row and converted to bits strings (e.g., multiple bits) and then encoded into codewords using a LDPC encoder. The neural network 550 may analyze the content of the image. For example, the neural network 550 may analyze previously decoded pixels of the image to determine the colors of the previously decoded pixels of the image. The colors may be represented using a value (e.g., a single value representing the color) or a plurality of values (e.g., RGB values, such as a red value, a green value, a blue value). Based on the previously decoded pixels, the neural network 550 may determine a set of likelihood values for the pixel. Each likelihood value may indicate the likelihood that a pixel is a certain color. For example, if there are four possible colors, the set of likelihood values may include four likelihood values. Each likelihood value may indicate the likelihood/probability that the pixel is one of the four colors.

The neural network 550 may provide the set of likelihood values determined by the neural network 550 (based on the analysis of the previously decoded codewords and/or the content of a data object) to the decoder 500. The decoder 500 may also determine a set of likelihood values for the codeword that is currently being decoded by the decoder 500. Referring to the image/pixel example, above, the decoder 500 may determine a set of likelihood values and/or decode the current pixel using a LDPC code. For example, as the decoder 500 is in the process of decoding the current pixel, the decoder 500 may determine the set of likelihood values. Each likelihood value may indicate the likelihood that a pixel is a certain color. For example, if there are four possible colors, the set of likelihood values may include four likelihood values. Each likelihood value may indicate the likelihood/probability that the pixel is one of the four colors.

As discussed above, the decoder 500 (e.g., the LDPC decoder) may use the set of likelihood values determined by the neural network 550 (e.g., a first set of likelihood values) and the set of likelihood values determined by the decoder 500 (e.g., a second set of likelihood values) to decode a codeword. In one embodiment, the decoder 500 may combine the first likelihood value of the second set of likelihood values. For example, if there are four possible colors for a pixel, each set of likelihood values may include one likelihood value for each of the four possible colors. The decoder 500 may determine a set of combined likelihood values using the likelihood values from both the sets of likelihood values. For example, the decoder 500 may combine the first likelihood value of the first set of likelihood values with the first likelihood value of the second set of likelihood values to determine, calculate, generate, obtain, etc., a first combined likelihood value.

The decoder 500 may use various functions, algorithms, operations, techniques, formulas, etc., to determine the combined likelihood values. In one embodiment, the decoder 500 may determine a combined likelihood value based on average of different likelihood values. For example, the decoder 500 may determine a combined likelihood value by determining the average of a first likelihood value of the first set of likelihood values and a first likelihood value of the second set of likelihood values. In another example, the decoder 500 may use a weighted average. For example, the decoder 500 may use a weight or weighting factor to adjust the likelihood values when determining the set of combined likelihood values. The set of likelihood values obtained from the neural network 550 may be given a higher weight than the set of likelihood values determined by the decoder 500, or vice versa. In a further example, the decoder 500 may generate a probability vector (e.g., a vector, list, etc., of probabilities) using based on the first set of likelihood values and the second set of likelihood values. The first set of likelihood values may include probabilities P_1 through P_X, where X is the number of possible values for a codeword. The second set of likelihood values may include probabilities Q_1 through Q_X, where X is the number of possible values for a codeword. The probability vector may be generated by multiplying the probabilities of the first set of likelihood values and the second set of likelihood values, and then normalizing the products. The probability vector (PV) may be defined based on the following equation (1):

$$PV = \frac{((P\_1 * Q\_1), (P_2 * Q\_2) \ldots (P\_X * Q\_X))}{((P_1 * Q_1) + (P_2 * Q_2) \ldots + (P_X * Q_X))} \quad (1)$$

In one embodiment, the decoder 500 may use the set of likelihood values determined by the neural network 550 (e.g., a first set of likelihood values) and the set of likelihood values determined by the decoder 500 (e.g., a second set of likelihood values) separately when decoding a codeword. For example, the decoder 500 may identify a first decoded value associated with the highest likelihood value in the first set of likelihood values and second decoded value associated with the highest likelihood value in the second set of likelihood values. If the first and second decoded values match, the decoder 500 may determine that the codeword was properly decoded to the decoded value. If the first and second decoded values do not match, the decoder 500 may determine how to proceed based on the decoded values. For example, the decoder 500 may select one of the decoded values and may determine that the codeword should be decoded to the selected decoded value. In another example, the decoder 500 select one of the decoded values based on a threshold likelihood value. For example, the decoder 500 may select one of the two decoded values if the likelihood value associated with the selected decoded value is above the threshold likelihood value. In a further example, the decoder 500 may transmit a message, packet, frame, value, etc., (e.g., return an error) indicating that the decoder 500 is unable to decode the codeword (due to the mismatch in the first and second decoded values).

Figure 6:
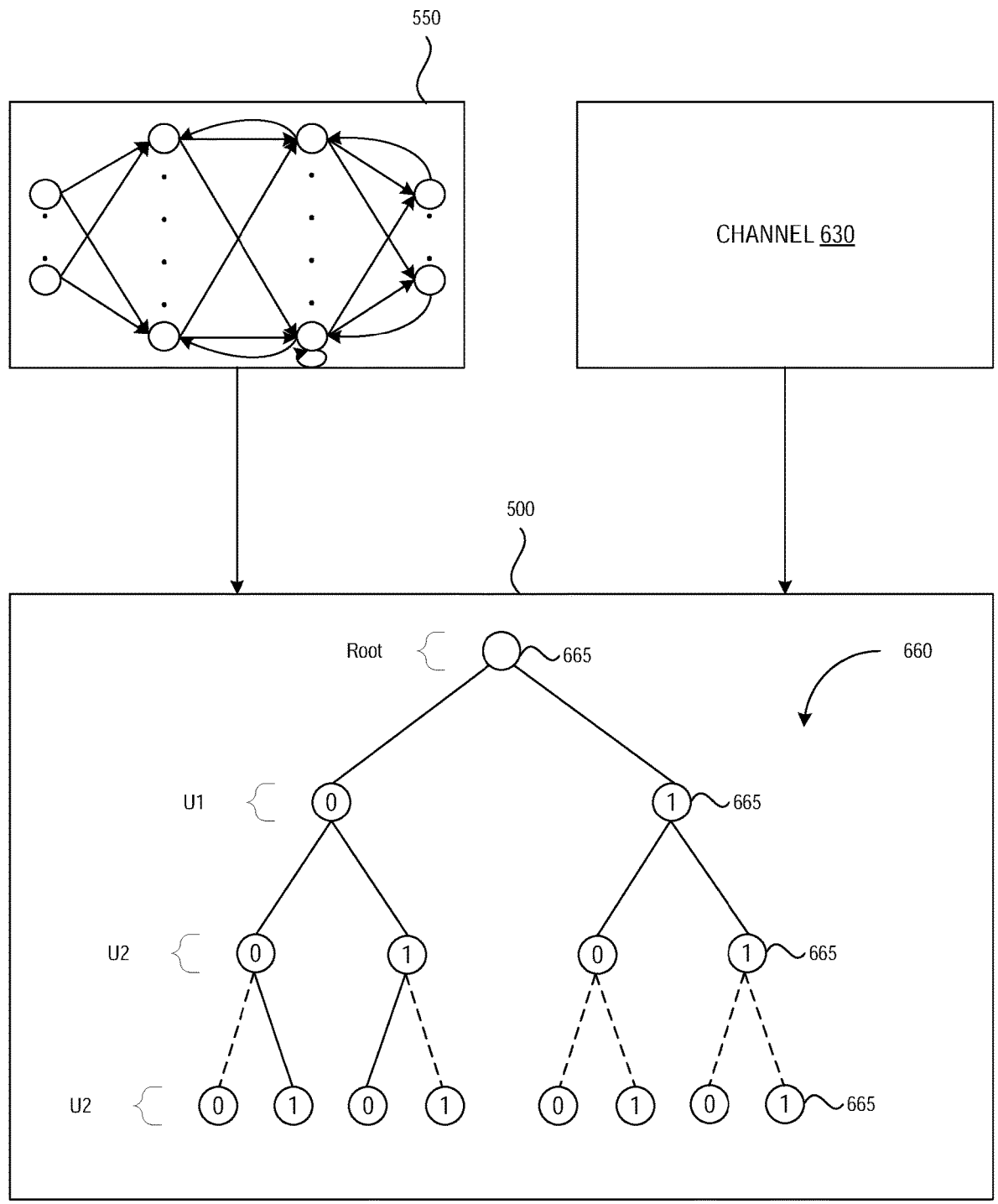
FIG. 6 is a diagram illustrating an example decoder and neural network, in accordance with one or more embodiments of the present disclosure.

FIG. 6 is a diagram illustrating an example decoder and neural network, in accordance with one or more embodiments of the present disclosure. The decoder 600 may be polar code decoder for decoding one or more bits of a codeword. The codewords may be received via a channel 630. In one embodiment, the channel 630 may be a communication channel between a controller and a non-volatile memory (e.g., NVM interface 150 illustrated in FIG. 1). In another embodiment, the channel 630 may be a communication channel between two computing devices. The codewords received on or via the channel 630 may have been encoded by encoder, such as a polar code encoder.

Decoder 600 may use list decoding to decode codewords that are received via the channel 630. For example, the decoder 600 may use successive cancellation list (SCL) decoding. The list decoding may use a tree 660 (e.g., a decoding tree) to decode the codewords. The tree 660 includes a root and three levels, U1, U2, and U3. Each level U1, U2, and U3 includes a number of nodes 665. The three levels may allow the tree 660 to decode codewords that are three bits long. Although three levels U1, U2, and U3 are illustrated in FIG. 6, the tree 660 may include a different number of levels in other embodiments. A tree with a different number of levels may be able to decode codewords with different lengths. For example, a tree with eight levels may be able to decode codewords that are eight bits long.

As illustrated in FIG. 6, the tree 660 may include multiple leaf nodes 665 (e.g., the nodes at level U3). The tree 660 may provide a path to each leaf node 665. For example, to reach the first leaf node 665 from the left, the path with the first node 665 in level U1, the first node 665 in level U2, and the first leaf node 665 in level U3 may be used. In another example, to reach the third leaf node from the left, the path with the first node 665 level in U1, the second node 665 in level U2, and the first leaf node 665 in level U3 may be used. Each path may represent a decoded value for the codeword. For example, the path to the first leaf node from the left may represent the decoded value "000." In another example, the path to the third leaf node from the left may represent the decoded value fifth leaf node from the left may represent the decoded value "100."

In one embodiment, the decoder 600 may determine a set of likelihood values, each likelihood value associated with a path to a leaf node 655. This may allow the decoder 600 to determine a likelihood that the codeword may decoded into each one of the possible decoded values. The decoder 600 may select a number of paths with the highest likelihood values. For example, the decoder 600 may select L paths with the highest likelihood values, where L may be a number between one and the total number of paths. The number of paths selected by the decoder 600 may vary in different embodiments. Because the decoder 600 may select a number of paths (e.g., L number of paths), the decoder 600 may be able to consider paths that are on different branches of the tree 660. For example, the decoder 600 may be able to consider a path on the left half of the tree (e.g., the path that may represent the decoded value "011") and a path on the right half of the tree (e.g., the path that may represent the decoded value "110").

As discussed above, the neural network 650 may be a RNN. The neural network 650 may analyze code words that were previously decoded by the decoder 600. For example, the decoder 600 may be decoding an image (e.g., an image file). The pixels of the image may be scanned row by row and converted to bits strings and then encoded into codewords using a polar code encoder. The neural network 650 may analyze the content of the image. For example, the neural network 650 may analyze previously decoded pixels of the image to determine the colors of the previously decoded pixels of the image. The colors may be represented using a value or a plurality of values. Based on the previously decoded pixels (e.g., based on the content of the data object), the neural network 650 may determine a set of likelihood values for the pixel. Each likelihood value may indicate the likelihood that a pixel is a certain color.

The neural network 650 may provide the set of likelihood values determined by the neural network 650 (based on the analysis of the previously decoded codewords) to the decoder 600. The decoder 600 may also determine a set of likelihood values for the codeword that is currently being decoded by the decoder 600. Referring to the image/pixel example, above, the decoder 600 may determine a set of likelihood values and/or decode the current pixel using a polar code. For example, as the decoder 600 is in the process of decoding the current pixel, the decoder 600 may determine the set of likelihood values. Each likelihood value may indicate the likelihood that a pixel is a certain color. For example, if there are eight possible colors (represented by three bits), the set of likelihood values may include eight likelihood values. Each likelihood value may indicate the likelihood/probability that the pixel is one of the eight colors.

As discussed above, the decoder 600 (e.g., the polar code decoder) may use the set of likelihood values determined by the neural network 650 (e.g., a first set of likelihood values) and the set of likelihood values determined by the decoder 600 (e.g., a second set of likelihood values) to decode a codeword. In one embodiment, the decoder 600 may combine the first likelihood value of the second set of likelihood values. The decoder 600 may use various functions, algorithms, operations, techniques, formulas, etc., to determine the combined likelihood values. In one embodiment, the decoder 600 may determine a combined likelihood value based on average of different likelihood values, as discussed above. For example the decoder 600 may determine a combined likelihood value by determining the average of a first likelihood value of the first set of likelihood values and a first likelihood value of the second set of likelihood values. In another example, the decoder 600 may use a weighted average. Based on the set of combined likelihood values, the decoder 600 may select L (e.g., a number between one and the total number of paths) paths with the highest combined (e.g., average) likelihood values.

In one embodiment, the decoder 600 may use the set of likelihood values determined by the neural network 650 (e.g., a first set of likelihood values) and the set of likelihood values determined by the decoder 600 (e.g., a second set of likelihood values) separately when decoding a codeword. For example, the decoder 600 may use the first set of likelihood values (determined by the neural network 650) to select L paths with the highest likelihood values. The decoder may use the second set of likelihood values (determined by the decoder 600) to identify the path with the highest likelihood value from the L selected paths. In another example, the decoder 600 may use the second set of likelihood values (determined by the decoder 600)) to select L paths with the highest likelihood values. The decoder may use the first set of likelihood values (determined by the neural network 650) to identify the path with the highest likelihood value from the L selected paths. In a further example, the decoder 600 may select a first set of L paths with the highest likelihood values from the first set of likelihood values and may select a second set of L paths with the highest likelihood values from the second set of likelihood values. The decoder 600 may identify common paths that are in both the first set and second set of paths and may select the path with the highest likelihood value from the common paths.

In another example, the decoder 600 may identify a first decoded value associated with path that has the highest likelihood value in the first set of likelihood values and may identify a second decoded value associated with path that has the highest likelihood value in the second set of likelihood values. If the first and second decoded values match, the decoder 600 may determine that the codeword was properly decoded to the decoded value. If the first and second decoded values do not match, the decoder 600 may determine how to proceed based on the decoded values, as discussed above.

Figure 7:
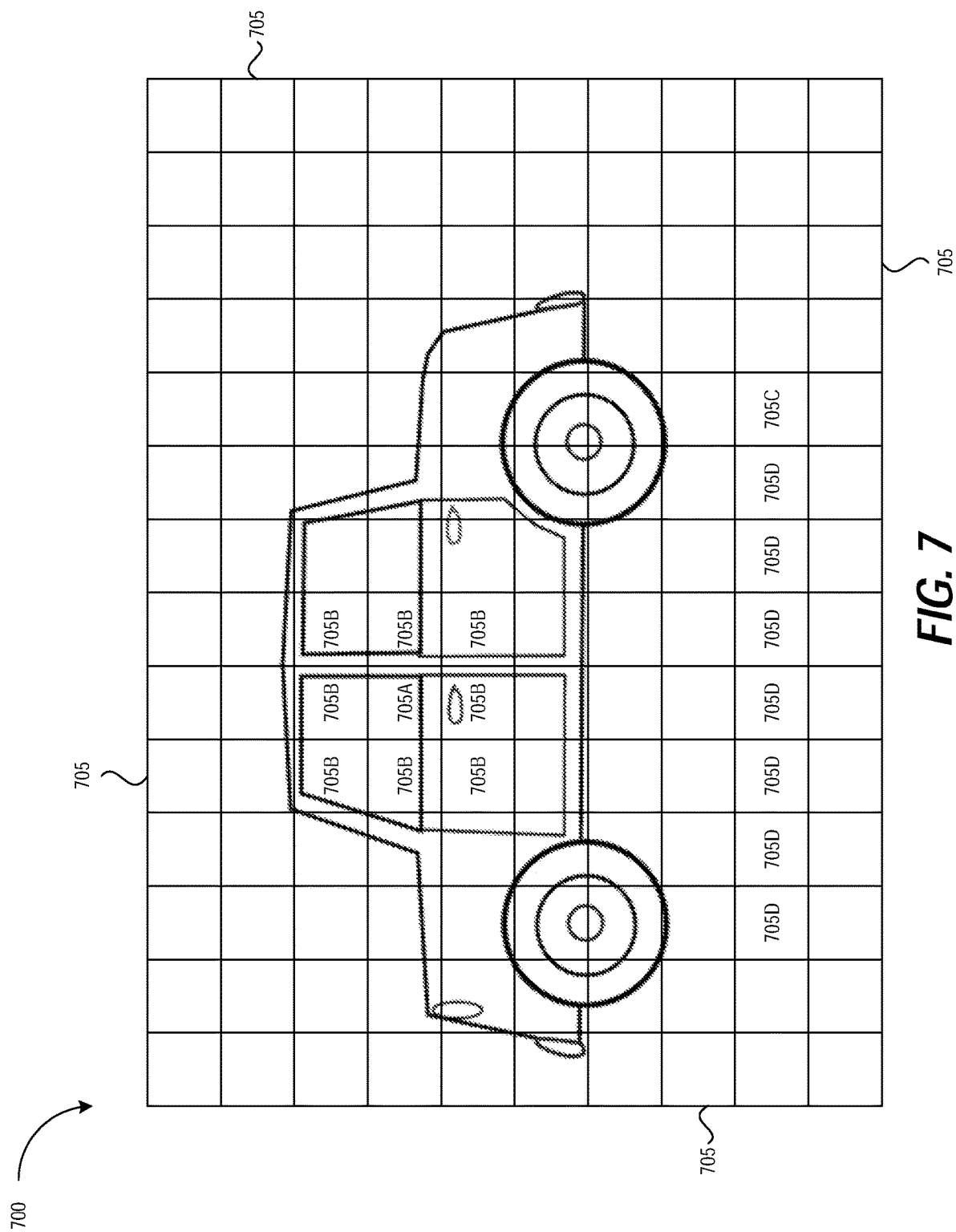
FIG. 7 is a diagram illustrating an example data object that may be decoded using a decoder and a neural network, in accordance with one or more embodiments of the present disclosure.

FIG. 7 is a diagram illustrating an example data object 700 that may be decoded using a decoder and a neural network, in accordance with one or more embodiments of the present disclosure. The data object 700 may be data structure that may be divided into different portions. The different portions of the data object may be encoded into the codewords which may be stored on a non-volatile memory and/or transmitted to different computing device. In one embodiment, the data object 700 may be an image file (e.g., a digital image). The data object may organize the codewords in a certain configuration, order, and/or layout. For example, if the data object 700 is an image (e.g., a digital image), the image may be divided into multiple pixels 705. Each codeword may encode a pixel 705 of the image. As illustrated in FIG. 7, the data object 700 may include fourteen columns of pixels 705 and ten rows of pixels 705 (e.g., may be a 14×10 image).

As discussed above, the decoder may decode the codewords for the data object 700 when retrieving the data object 700 from a non-volatile memory and/or when receiving the data object 700 on a communication channel. As the decoder decodes the codewords, the pixels decoded from the codewords (e.g., the numbers, data, values, etc., representing a pixel) may be provided to the neural network. The neural network may analyze previously decoded pixels and may use the previously decoded pixels when decoding a current codeword (e.g., when attempted to decode an encoded pixel or codeword).

In one embodiment, the previously decoded pixels (e.g., previously decoded values) that are analyzed by the neural network may be adjacent to the current codeword that is being decoded decoder. For example, the decoder may currently be decoding pixel 705A. Pixels 705B are adjacent to pixel 705A and may have been previously decoded by the decoder. The neural network may determine a set of likelihood values based on an analysis of pixels 705B. For example, if the neural network determines that the pixels 705B have a color red, the neural network may determine that there is a high likelihood that the pixel 705A may also be red. The set of likelihood values obtained by the neural network may indicate that the neural network has determined that there is a high likelihood that the pixel 705A may also be red. For example, the likelihood value associated with the color (or value) red may be the highest likelihood value in the set of likelihood values may.

In another embodiment, the previous pixels that are analyzed by the neural network may be pixels that preceded the codeword that is currently being decoded by the decoder. For example, the decoder may currently be decoding pixel 705C. Pixels 705D may precede pixel 705C when the decoder decodes the pixels from row by row, from left to right. The neural network may determine a set of likelihood values based on an analysis of pixels 705D. For example, if the neural network determines that the pixels 705B have a color yellow, the neural network may determine that there is a high likelihood that the pixel 705A may also be yellow. The set of likelihood values obtained by the neural network may indicate that the neural network has determined that there is a high likelihood that the pixel 705A may also be yellow. For example, the likelihood value associated with the color (or value) yellow may be the highest likelihood value in the set of likelihood values may.

Figure 8:
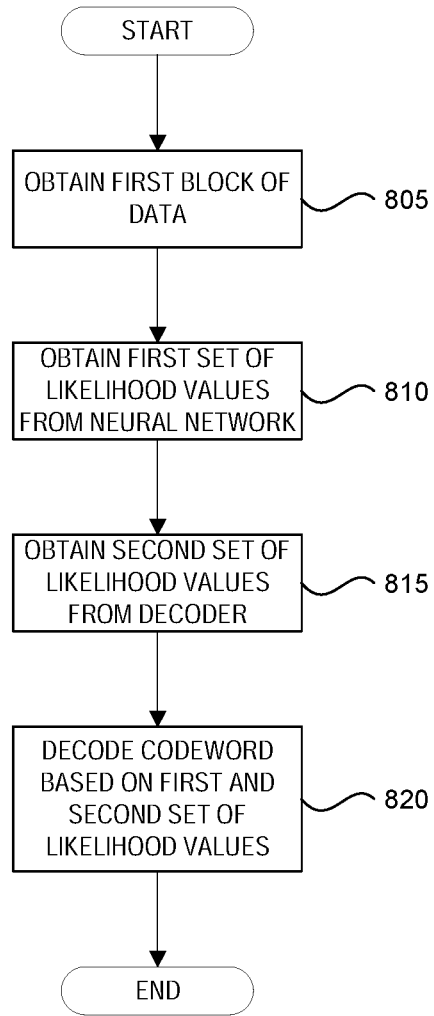
FIG. 8 is a flowchart illustrating an example a process for decoding data, in accordance with one or more embodiments of the present disclosure.

FIG. 8 is a flowchart illustrating an example a method 800 for decoding data, in accordance with one or more embodiments of the present disclosure. The method 800 may be performed by a processing device (e.g., a processor, a central processing unit (CPU), a controller, an application-specific integrated circuit (ASIC), a field programmable gate array (FPGA), etc.), a neural network, a decoder, etc. For example, the method 800 may be performed by a controller or processor of a data storage device. The controller, processing device, neural network, and/or decoder may be processing logic that includes hardware (e.g., circuitry, dedicated logic, programmable logic, microcode, etc.), software (e.g., instructions run on a processor to perform hardware simulation), firmware, or a combination thereof.

The method 800 begins at block 805 where the method 800 obtains a first block of data. The first block of data may include a codeword that is to be decoded. The codeword may be generated by an encoder (e.g., a LDPC encoder, a polar encoder, etc.). The codeword may be obtained, retrieved, read, etc., from a non-volatile memory (e.g., a storage medium). The codeword may also be received from another computing device via a network and/or communication channel.

At block 810, the method 800 may obtain a first set of likelihood values from a neural network. The first set of likelihood values may indicate probabilities that the codeword will be decoded into one of a plurality of decoded values. The first set of likelihood values may be based on previously decoded blocks of data that have been processed by the neural network, as discussed above. The previously decoded blocks of data may be blocks of data that proceed or that are adjacent to the block of data. The neural network may be a CNN or a RNN. At block 815, the method 800 may obtain a second set of likelihood values from the decoder. The second set of likelihood values may indicate probabilities that the codeword will be decoded into one of a plurality of decoded values. The decoder may be an LDPC decoder, a polar code decoder, etc.

At block 820, the method 800 may decode the data based on the first set of likelihood values and the second set of likelihood values, as discussed above. For example, the neural network may be a RNN and the decoder may be a LDPC decoder. The method 800 may provide the first set of likelihood values to one or more variable nodes of the LDPC decoder. In another example, neural network may be a CNN and the decoder may be a polar code decoder. The method 800 may provide the first set of likelihood values to the polar code decoder and the polar code decoder may select paths in a decoding tree based on the first and second set of likelihood values.

Although the present disclosure may refer to CNNs, RNNs, etc., other types of neural networks and/or machine learning methods, functions, techniques, operations, data structures, etc., may be used in other embodiments. For example, a probabilistic neural network may be used in other embodiments. In addition, although the present disclosure may refer to ECCs such as LDPC codes, polar codes, etc., other types of error correction codes and/or error correction methods, functions, techniques, operations, schemes, etc., may be used in other embodiments.

Some embodiments of the present disclosure may be used to advantage in error correction code schemes in data storage devices and/or computing devices. For example, some embodiments of the present disclosure may allow for more robust and/or efficient decoding and/or error correction of data by using likelihood values generated by a neural network and by a decoder. This may allow the data storage devices and/or computing devices to decode and/or correct data in more instances, situations, etc., without increasing the complexity of the error correction codes/schemes that are used by encoders and/or decoders.

GENERAL COMMENTS

Those skilled in the art will appreciate that in some embodiments, other types of distributed data storage systems may be implemented while remaining within the scope of the present disclosure. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Furthermore, the terms "first," "second," "third," "fourth," etc., as used herein are meant as labels to distinguish among different elements and may not necessarily have an ordinal meaning according to their numerical designation.

All of the processes described above may be embodied in, and fully automated via, software code modules executed by one or more general purpose or special purpose computers or processors. The code modules may be stored on any type of computer-readable medium or other computer storage device or collection of storage devices. Some or all of the methods may alternatively be embodied in specialized computer hardware.

What is claimed is:

1. A method, comprising:
   obtaining a first block of data from a storage medium, wherein the first block of data comprises a first codeword generated based on an error correction code;
   obtaining a first set of likelihood values from a neural network, wherein each likelihood value of the first set of likelihood values indicates a probability that the first codeword will be decoded into a respective decoded value of a plurality of decoded values;
   obtaining a second set of likelihood values from a decoder based on the first block of data, wherein each likelihood value of the second set of likelihood values indicates a probability that the first codeword will be decoded into a respective decoded value of the plurality of decoded values; and
   decoding the first codeword to obtain a decoded value based on the first set of likelihood values and the second set of likelihood values,
   wherein the first set of likelihood values is based at least in part on previously decoded blocks of data that have been processed by the neural network, the previously decoded blocks of data comprising blocks of data that are adjacent to the first block of data or blocks of data that preceded the first block of data.

2. The method of claim 1, wherein the decoder comprises a low-density parity-check (LDPC) decoder and wherein the error correction code comprises a LDPC code.

3. The method of claim 2, wherein the LDPC decoder comprises a set of variable nodes coupled to a set of check nodes.

4. The method of claim 3, wherein decoding the first codeword comprises:
   providing the first set of likelihood values to the set of variable nodes of the LDPC decoder.

5. The method of claim 1, wherein the decoder comprises a polar code decoder and wherein the error correction code comprises a polar code.

6. The method of claim 5, wherein decoding the first codeword comprises:
   determining a set of decoding paths based on the first set of likelihood values and the second set of likelihood values;
   decoding the first codeword based on the set of decoding paths.

7. A method, comprising:
   receiving, via a network interface, a first block of data transmitted by a computing device, wherein the first block of data comprises a first codeword generated by the computing device based on an error correction code;
   obtaining a first set of likelihood values from a neural network, wherein each likelihood value of the first set of likelihood values indicates a probability that the first codeword will be decoded into a respective decoded value of a plurality of decoded values;
   obtaining a second set of likelihood values from a decoder based on the first block of data, wherein each likelihood value of the second set of likelihood values indicates a probability that the first codeword will be decoded into a respective decoded value of the plurality of decoded values; and
   decoding the first codeword to obtain a decoded value based on the first set of likelihood values and the second set of likelihood values.

8. The method of claim 7, wherein the first set of likelihood values is based on previously decoded blocks of data that have been processed by the neural network.

9. The method of claim 8, wherein the decoder comprises a low-density parity-check (LDPC) decoder and wherein the error correction code comprises a LDPC code.

10. The method of claim 8, wherein the LDPC decoder comprises a set of variable nodes coupled to a set of check nodes.

11. The method of claim 10, wherein decoding the first codeword comprises:
    providing the first set of likelihood values to the set of variable nodes of the LDPC decoder.

12. The method of claim 7, wherein the decoder comprises a polar code decoder and wherein the error correction code comprises a polar code.

13. The method of claim 12, wherein decoding the first codeword comprises:
    determining a set of decoding paths based on the first set of likelihood values and the second set of likelihood values;
    decoding the first codeword based on the set of decoding paths.

14. An apparatus, comprising:
    a processing device configured to:
       obtain a first block of data, wherein the first block of data comprises a first codeword generated based on an error correction code;
       obtain a first set of likelihood values from a neural network, wherein each likelihood value of the first set of likelihood values indicates a probability that the first codeword will be decoded into a respective decoded value of a plurality of decoded values;
       obtain a second set of likelihood values from a decoder based on the first block of data, wherein each likelihood value of the second set of likelihood values indicates a probability that the first codeword will be decoded into a respective decoded value of the plurality of decoded values; and
       decode the first codeword to obtain a decoded value based on the first set of likelihood values and the second set of likelihood values.

15. The apparatus of claim 14, further comprising non-volatile memory configured to store the first block of data, wherein the processing device is coupled to the non-volatile memory and is further configured to obtain the first block of data from the non-volatile memory.

16. The apparatus of claim 14, further comprising a network interface and wherein the processing device is further configured to obtain the first block of data via the network interface.

17. The apparatus of claim 14, wherein the first set of likelihood values is based on previously decoded blocks of data that have been processed by the neural network.

18. The apparatus of claim 17, wherein:
the previously decoded blocks of data and the first block of data are organized within a data object according to a layout; and
the layout indicates the location of the first block of data relative to the previously decoded blocks of data.

19. The apparatus of claim 17, wherein:
the first block of data comprises a first pixel of an image; and
the previously decoded blocks of data comprise pixels of the image that are adjacent to the first pixel or that precede the first pixel within a row of pixels.

20. The apparatus of claim 14, wherein:
the decoder comprises a low-density parity-check (LDPC) decoder,
the error correction code comprises a LDPC code that comprises a set of variable nodes coupled to a set of check nodes, and
the processing device is further configured to decode the first codeword by providing the first set of likelihood values to the set of variable nodes of the LDPC decoder.

* * * * *